(12) United States Patent
Hoffmeyer et al.

(10) Patent No.: US 11,703,922 B2
(45) Date of Patent: Jul. 18, 2023

(54) THERMAL INTERFACE MATERIAL STRUCTURES FOR DIRECTING HEAT IN A THREE-DIMENSIONAL SPACE

(71) Applicant: INTERNATIONAL BUSINESS MACHINES CORPORATION, Armonk, NY (US)

(72) Inventors: Mark K. Hoffmeyer, Rochester, MN (US); Christopher M. Marroquin, Rochester, MN (US); Eric J. Campbell, Rochester, MN (US); Sarah K. Czaplewski-Campbell, Rochester, MN (US); Phillip V. Mann, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/852,711

(22) Filed: Jun. 29, 2022

(65) Prior Publication Data
US 2022/0334625 A1    Oct. 20, 2022

Related U.S. Application Data

(62) Division of application No. 16/847,144, filed on Apr. 13, 2020, now Pat. No. 11,416,045.

(51) Int. Cl.
  *H05K 7/20* (2006.01)
  *G06F 1/20* (2006.01)

(52) U.S. Cl.
  CPC .......... *G06F 1/20* (2013.01); *H05K 7/20481* (2013.01)

(58) Field of Classification Search
  CPC .. G06F 1/20; H05K 7/20472; H05K 7/20481; H05K 9/0026
  See application file for complete search history.

(56) References Cited

U.S. PATENT DOCUMENTS

| 5,323,292 A | 6/1994 | Brzezinski |
| 5,625,229 A | 4/1997 | Kojima et al. |
| (Continued) | | |

FOREIGN PATENT DOCUMENTS

| CN | 102280418 A | 12/2011 |
| CN | 204584067 U | 8/2015 |
| (Continued) | | |

OTHER PUBLICATIONS

International Search Report and Written Opinion, PCT/IB2021/052311, dated Jun. 24, 2021, 9 pages.
(Continued)

*Primary Examiner* — Jacob R Crum
(74) *Attorney, Agent, or Firm* — Nathan M. Rau

(57) ABSTRACT

A thermal interface material (TIM) structure for directing heat in a three-dimensional space including a TIM sheet. The TIM sheet includes a lower portion along a lower plane; a first side portion along a first side plane; a first upper portion along an upper plane; a first fold between the lower portion and the first side portion positioning the first side portion substantially perpendicular to the lower portion; and a second fold between the first side portion and the first upper portion positioning the first upper portion substantially perpendicular to the first side portion and substantially parallel to the lower portion.

17 Claims, 8 Drawing Sheets

(56) References Cited

U.S. PATENT DOCUMENTS

| | | |
|---|---|---|
| 6,484,980 B2 | 11/2002 | Medlin et al. |
| 6,982,877 B2 | 1/2006 | Vinson et al. |
| 7,726,385 B2 | 6/2010 | Mok |
| 8,310,045 B2 | 11/2012 | Son |
| 9,257,364 B2 | 2/2016 | Ahuja et al. |
| 9,342,118 B2 | 5/2016 | Barina et al. |
| 9,743,558 B2 | 8/2017 | Bosak et al. |
| 10,168,749 B2 | 1/2019 | Aoki et al. |
| 10,681,801 B2 | 6/2020 | Kotlar |
| 2002/0015288 A1 | 2/2002 | Dibene et al. |
| 2007/0152325 A1* | 7/2007 | Dani .................. H01L 23/3731 257/E23.101 |
| 2011/0075377 A1 | 3/2011 | Paquette et al. |
| 2011/0075388 A1 | 3/2011 | Zadesky |
| 2011/0096505 A1 | 4/2011 | Inoue |
| 2011/0242764 A1* | 10/2011 | Hill ........................ G06F 1/203 361/705 |
| 2013/0214406 A1 | 8/2013 | Schultz |
| 2013/0306273 A1 | 11/2013 | Iyengar et al. |
| 2014/0177166 A1 | 6/2014 | Nardi et al. |
| 2014/0217575 A1 | 8/2014 | Hung |
| 2015/0170989 A1* | 6/2015 | Dhavaleswarapu ........................ H01L 23/3675 438/122 |
| 2015/0301568 A1* | 10/2015 | Hill ........................ G06F 1/20 29/890.03 |
| 2016/0100511 A1 | 4/2016 | Kurz et al. |
| 2017/0148767 A1 | 5/2017 | Hung et al. |
| 2017/0186628 A1 | 6/2017 | Antoniswamy et al. |
| 2017/0221793 A1 | 8/2017 | Smalley et al. |
| 2018/0110158 A1* | 4/2018 | Talpallikar .............. F28F 21/02 |
| 2018/0203496 A1 | 7/2018 | Campbell et al. |
| 2020/0135701 A1 | 4/2020 | Li et al. |
| 2020/0234616 A1 | 7/2020 | Ha et al. |
| 2020/0276658 A1 | 9/2020 | Fujii et al. |
| 2020/0292429 A1 | 9/2020 | Fujii et al. |
| 2021/0318734 A1 | 10/2021 | Hoffmeyer et al. |

FOREIGN PATENT DOCUMENTS

| | | |
|---|---|---|
| CN | 108105732 A | 6/2018 |
| CN | 208288806 U | 12/2018 |
| CN | 109937617 A | 6/2019 |
| WO | 2017112332 A1 | 6/2017 |

OTHER PUBLICATIONS

Appendix P; List of IBM Patent or Applications Treated as Related, Jun. 29, 2022, 2 pages.

* cited by examiner

THERMAL INTERFACE MATERIAL STRUCTURES FOR DIRECTING HEAT IN A THREE-DIMENSIONAL SPACE

BACKGROUND

Field of the Invention

The field of the invention is data processing, or, more specifically, methods and system for thermal interface material structures for directing heat in a three-dimensional space.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

These advances in computer systems have led to the need for more efficient heat management within such complex systems. In order to get the best performance from certain components, particularly central and graphics processing units, heat must quickly and efficiently be removed from these components and nearby areas. Often however, such components are situated near other components that produce relatively less heat that also require quick and efficiently heat removal. Complicating matters further, different components may have different load requirements to maintain workable temperatures.

SUMMARY

Thermal interface material structures for directing heat in a three-dimensional space may include: a thermal interface material (TIM) sheet including: a lower portion along a lower plane; a first side portion along a first side plane; a first upper portion along an upper plane; a first fold between the lower portion and the first side portion positioning the first side portion substantially perpendicular to the lower portion; and a second fold between the first side portion and the first upper portion positioning the first upper portion substantially perpendicular to the first side portion and substantially parallel to the lower portion.

Advantages provided by such embodiments for thermal interface material structures for directing heat in a three-dimensional space include providing a thermal interconnect between a heat exchanger and/or a heat spreader plate and components at different elevations relative to a circuit board. Advantages further include providing a thermal interconnect between components with different load requirements. The three-dimensional shape of the TIM sheet allows for accurate TIM placement and retention during manufacturing. The larger surface area provides continuous heat transfer and heat spreading. The three-dimensional TIM sheet is highly compressible, highly conductive at lower loads, and provides a range of gap filling capability for small gaps. Finally, the TIM sheet is easily assembled, easily reworked, and easily replaced. These advantages are achieved by using a single TIM sheet folded to provide a thermal interconnect between at least two planes within a system.

In an optional embodiment, the TIM sheet may further include a second side portion along a second side plane; a second upper portion along the upper plane; a third fold between the lower portion and the second side portion positioning the second side portion substantially perpendicular to the lower portion; and a fourth fold between the second side portion and the second upper portion positioning the second upper portion substantially perpendicular to the second side portion and substantially parallel to the lower portion. This provides the advantage of an additional portion of the TIM sheet that extends the thermal interconnect to another section of the upper plane.

In an optional embodiment, thermal interface material structures for directing heat in a three-dimensional space may further include a gap filler pad in thermal contact with the first upper portion. This provides the advantage of ensuring reliable thermal contact with elements above and below the upper portion of the TIM sheet, such as a heat spreader plate and heat exchanger.

In an optional embodiment, the upper portion of the TIM sheet may include additional alternating folds creating adjacent layers of the TIM sheet, or an upper portion that is coiled. This provides the advantage of additional gap filling for different types of gaps while maintaining a thermal interconnect with the TIM sheet.

Thermal interface material structures for directing heat in a three-dimensional space may include a system that includes: a circuit board comprising a first component having a first load requirement and a second component having a second load requirement; a heat exchanger; and a heat spreader plate in thermal contact with the first component, wherein the heat spreader plate comprises a cavity exposing the second component; and a thermal interface material (TIM) sheet comprising: a lower portion positioned between and in thermal contact with the second first component and the heat exchanger; a first upper portion positioned between and positioned between and in thermal contact with the heat spreader plate and the heat exchanger and the second component; and a first side portion connecting the lower portion to the first upper portion.

Advantages provided by such embodiments for thermal interface material structures for directing heat in a three-dimensional space include providing a thermal interconnect between a heat exchanger and components at different elevations relative to a circuit board. Advantages further include providing a thermal interconnect between components with different load requirements. These advantages are achieved by using a single TIM sheet folded to provide a thermal interconnect between a circuit board component, a heat spreader plate, and heat exchanger at different planes within a system.

In an optional embodiment, the system includes a heat spreader plate positioned between and in thermal contact with the second component and the first upper portion, wherein the heat spreader plate comprises a cavity exposing the first component, and wherein the first side portion connects the lower portion to the first upper portion through the cavity in the heat spreader plate. This provides the advantage of providing a heat spreading agent between the second component and the TIM sheet.

In an optional embodiment, the TIM sheet further comprises a gap filler pad between and in thermal contact with the first upper portion and the heat exchanger. This provides the advantage of ensuring reliable thermal contact with the heat spreader plate and heat exchanger above and below the upper portion of the TIM.

In an optional embodiment, the TIM sheet may further include a second upper portion positioned between and in thermal contact with the heat spreader plate and the heat exchanger; and a second side portion connecting the lower portion to the second upper portion through the cavity in the heat spreader plate. This provides the advantage of an additional portion of the TIM that extends the thermal interconnect to another section of the upper plane between the heat spreader plate and the heat exchanger.

In an optional embodiment, thermal interface material structures for directing heat in a three-dimensional space may further include an upper portion with additional alternating folds creating adjacent layers of the TIM sheet, or an upper portion that is coiled. This provides the advantage of additional gap filling for different types of gaps while maintaining a thermal interconnect with the TIM sheet.

Methods for forming thermal interface material structures for directing heat in a three-dimensional space may include: placing a TIM sheet between an upper forming tool and a lower forming tool; pressing the upper forming tool to the lower forming tool creating a first fold and a second fold in the TIM sheet, where the first fold is between a lower portion of the TIM sheet and a first side portion of the TIM sheet, where the first fold positions the first side portion of the TIM sheet substantially perpendicular to the lower portion of the TIM sheet, where the second fold is between the first side portion of the TIM sheet and a first upper portion of the TIM sheet, and where the second fold positions the first upper portion of the TIM sheet substantially perpendicular to the first side portion of the TIM sheet and substantially parallel to the lower portion of the TIM sheet.

Advantages provided by such embodiments for forming thermal interface material structures for directing heat in a three-dimensional space include forming a three-dimensional TIM sheet that provides a thermal interconnect between a heat exchanger and/or a heat spreader plate and components at different elevations relative to a circuit board. Advantages further include forming a TIM sheet that provides a thermal interconnect between components with different load requirements. These advantages are achieved by folding a single TIM sheet to provide a thermal interconnect between at least two planes within a system.

In an optional embodiment, methods for forming thermal interface material structures for directing heat in a three-dimensional space may further include pressing the upper forming tool to the lower forming tool to compresses the upper portion of the TIM sheet without compressing the lower portion of the TIM sheet. This provides the advantage of forming the three-dimensional TIM sheet without unnecessarily compressing and avoiding degradation of the lower portion which may be used to make thermal contact with a component with higher heat generation and a lower-load requirement.

In an optional embodiment, pressing the upper forming tool to the lower forming tool further creates a third fold and a fourth fold in the TIM sheet, where the third fold is between the lower portion of the TIM sheet and a second side portion of the TIM sheet, where the third fold positions the second side portion of the TIM sheet substantially perpendicular to the lower portion of the TIM sheet, where the fourth fold is between the second side portion of the TIM sheet and a second upper portion of the TIM sheet, and where the fourth fold positions the second upper portion of the TIM sheet substantially perpendicular to the second side portion of the TIM sheet and substantially parallel to the lower portion of the TIM sheet. This provides the advantage of an additional portion of the TIM sheet that extends the thermal interconnect to another section of the upper plane.

In an optional embodiment, pressing the upper forming tool to the lower forming tool creates additional folds creating adjacent layers of the TIM sheet adjacent and substantially parallel to the first upper portion, or rolling the first upper portion into a coil. This provides the advantage of additional gap filling for different types of gaps while maintaining a thermal interconnect with the TIM sheet.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
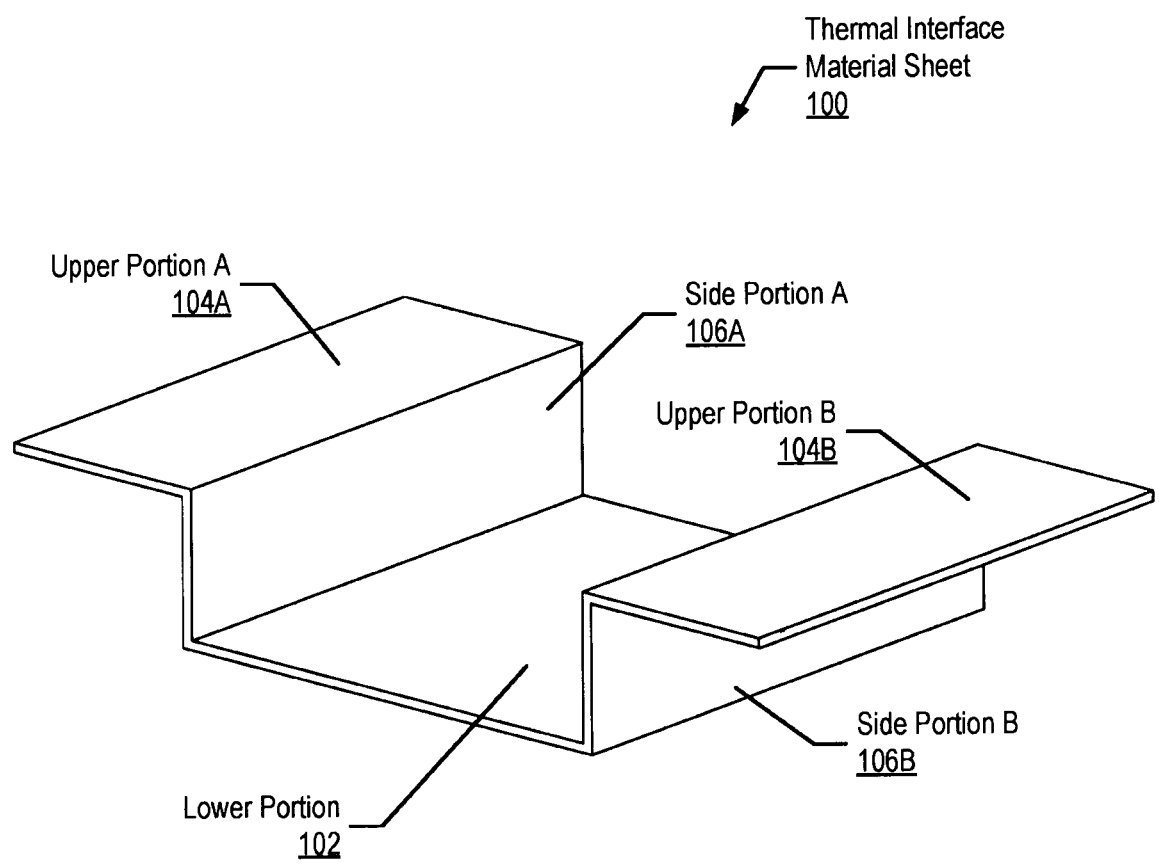
FIG. 1 sets forth a diagram depicting an example thermal interface material (TIM) sheet for directing heat in a three-dimensional space according to embodiments of the present invention.

FIG. 1 sets forth a diagram depicting an example thermal interface material (TIM) sheet for directing heat in a three-dimensional space according to embodiments of the present invention. As shown in FIG. 1, the TIM sheet (100) includes a lower portion (102), two upper portions (upper portion A (104A), upper portion B (104B)), and two side portions (side portion A (106A), side portion B (106B)).

The TIM sheet (100) is a single, continuous sheet of thermal conducting material. The TIM sheet may be a single material type, such as a graphite TIM sheet. Alternatively, the TIM sheet may be a composite material, such as a particle or fiber filled silicone and/or acrylate TIM sheet. Additionally, the TIM sheet may be a cured or partially cured elastomer matrix, such as silicone, filled with any number of thermally conductive materials. Such thermally conductive materials may include ceramic particles such as, but not limited to, aluminum nitride, boron, nitride, zinc oxide, or aluminum oxide. Such thermally conductive materials may also include metal particles or metal plated particles such as, but not limited to, aluminum, copper, silver, gold, or tungsten, and particle fillers comprising an array of carbon morphologies including, for example, graphite flakes, carbon fibers, carbon nanotubes, or crystalline diamond particles. Non-silicone elastomer matrices with an array of fillers cited above may also be used for TIM pads. Folded TIM sheets may be created from polymeric phase change material matrices filled with the above sets of particle materials. Folded TIM sheets may also be made from metals such as, but not limited to, indium or aluminum clad indium. Further, the TIM sheet may be compressible in that as pressure is applied to the TIM sheet, the thickness of the TIM sheet may be reduced.

As shown in FIG. 1, the lower portion (102) of the TIM sheet is along a lower plane. The side portions (side portion A (106A), side portion B (106B)) are along two side planes substantially parallel to each other. A fold between the lower portion (102) and the side portions (side portion A (106A), side portion B (106B)) position the side portions (side portion A (106A), side portion B (106B)) substantially perpendicular to the lower portion (102) and substantially parallel to the other side portion. The upper portions (upper portion A (104A), upper portion B (104B)) are along an upper plane substantially parallel to the lower plane. Folds between the side portions (side portion A (106A), side portion B (106B)) and the upper portions (upper portion A (104A), upper portion B (104B)) position the upper portions (upper portion A (104A), upper portion B (104B)) substantially perpendicular to the side portions (side portion A (106A), side portion B (106B)) and substantially parallel to the lower portion (102).

An embodiment that includes the lower portion (102), a single side portion (e.g., side portion (106A)), and a single upper portion (e.g., upper portion A (104A)) has the advantage of providing a thermal interconnect between components on different planes addressing different working heights of hardware using a single TIM sheet, while being less complicated to form due to only requiring two folds of the TIM material. An embodiment that includes the lower portion (102) two upper portions (upper portion A (104A), upper portion B (104B)), and two side portions (side portion A (106A), side portion B (106B)) has the advantage of providing a larger thermal interconnect between components on multiple different planes addressing different working heights of hardware using a single TIM sheet.

Although the TIM sheet (100) of FIG. 1 is shown with four folds each at 90 degree angles, other embodiments include different numbers of folds at various angles. Such embodiments may also provide a TIM sheet that thermally connects two layers in three-dimensional space.

Figure 2:
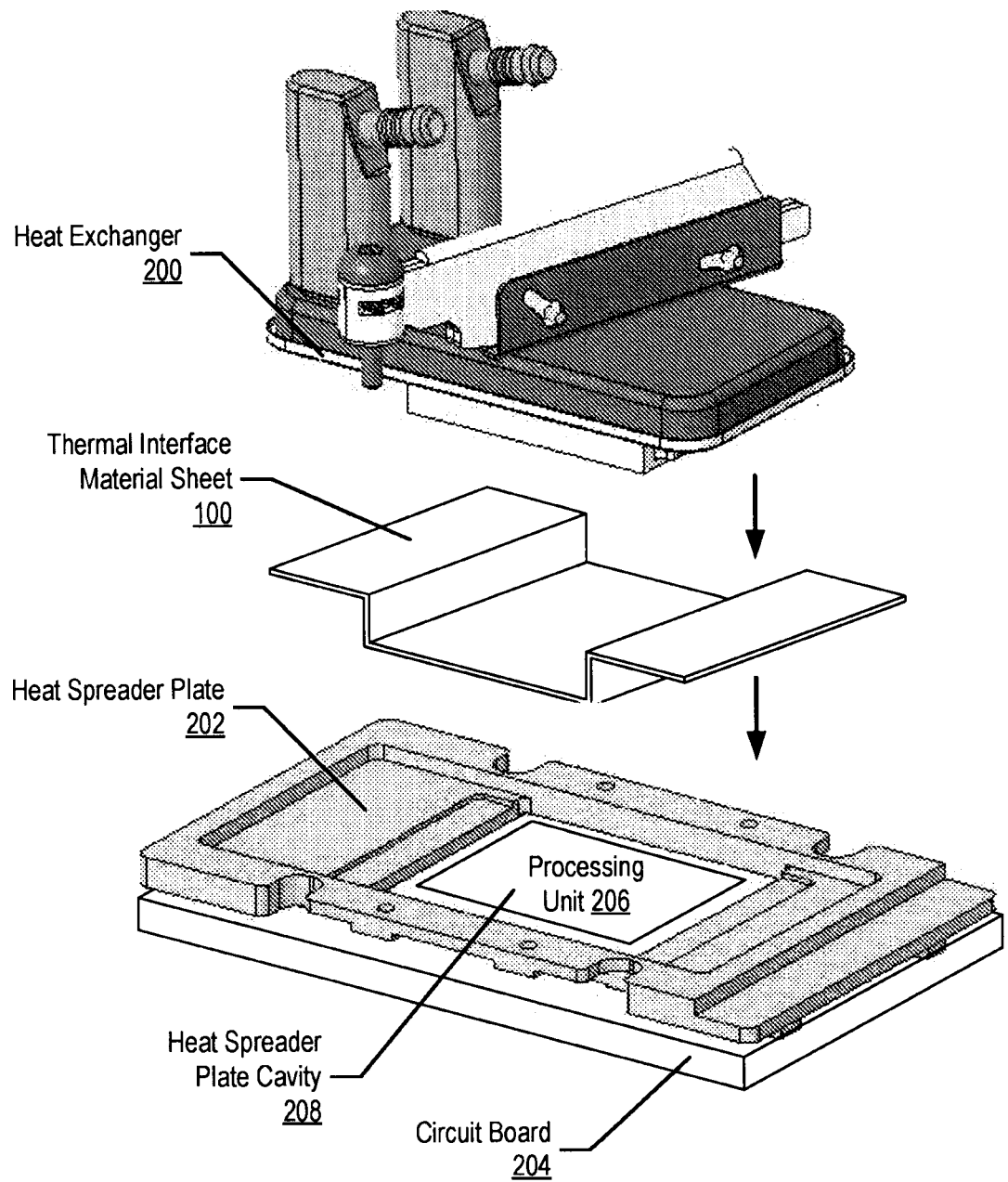
FIG. 2 sets forth a diagram depicting an example system with a TIM structure for directing heat in a three-dimensional space according to embodiments of the present invention.

FIG. 2 sets forth a diagram depicting an example system with a TIM structure for directing heat in a three-dimensional space according to embodiments of the present invention. The example system includes a heat exchanger (200), a TIM sheet (100), a heat spreader plate (202), and a circuit board (204). The heat spreader plate (202) includes a heat spreader plate cavity (208). The circuit board (204) includes multiple components underneath the heat spreader plate (202), including a processing unit (206) visible through the heat spreader plate cavity (208). Although depicted as being entirely surrounded by the heat spreader plate (202), the heat spreader plate cavity (208) may be only partially surrounded by the heat spreader plate (202).

The circuit board (204) is a collection of electronic components typically connected to layers of conductive and non-conductive substrate. Some of the components on the circuit board (204) require or benefit from being in thermal contact with a heat dissipation mechanism. FIG. 2 depicts a heat spreader plate (202) on top of the circuit board and, although not visible in FIG. 2, the heat spreader plate (202) is in thermal contact with a number of components on the circuit board (204), either directly or via a TIM (e.g., a TIM sheet, TIM grease, etc.).

The heat spreader plate (202) is a plate of thermally conductive material that transfers heat away from components on the circuit board (204) thermally connected to the heat spreader plate (202) and toward the heat exchanger (200). The heat exchanger (200) is a mechanism, such as a cold plate, that transfers heat from the heat spreader plate (202) and the processing unit (206) to a fluid medium and dissipated. The heat exchanger (200) may be a liquid or air cooled. The heat exchanger may be used in combination with a heat spreader plate (202), as shown in FIG. 2. Alternatively, the heat exchanger (200) may be used without a heat spreader plate, with the TIM sheet (100) placed between the heat exchanger (200) and the components of the circuit board (204).

Different components on the circuit board (204), such as the processing unit (206), may have different heat removal and load requirements. Particularly, the processing unit (206) may generate more heat than other components (not shown) on the circuit board and have a lesser load requirement than other components on the circuit board (204). The cavity in the heat spreader plate (202) provides the heat exchanger (200) more direct access to the processing unit (206) in order to remove heat more effectively from the processing unit (206). The cavity in the heat spreader plate (202) provides also allows the load on the processing unit (206) to be different than the load placed on the other components in thermal contact with the heat spreader.

To accommodate the above configuration of the circuit board (204), heat spreader plate (202) and the heat exchanger (200), the TIM sheet (100) provides a thermal interconnect between the processing unit (206), heat spreader plate (202), and the heat exchanger (200). The bottom of the lower portion of the TIM sheet (100) makes thermal contact with the processing unit (206). The top of the lower portion of the TIM sheet (100) makes thermal contact with the heat exchanger (200). The bottom of the upper portions of the TIM sheet (100) makes thermal contact with the heat spreader plate (202). Finally, the top of the upper portions of the TIM sheet (100) makes thermal contact with the heat exchanger (200) (optionally with the gap fillers shown in FIG. 4 and FIG. 5 and discussed in the associated text). The side portions of the TIM sheet (100) provide a thermal interconnect between each other portion of the TIM sheet (100) and the elements in thermal contact with those portions of the TIM sheet (100).

The load requirements for a component, such as the processing unit (206) refers to limits (maximums or minimums) to the amount of pressure applied to a component for optimal functionality or to avoid negative impacts to the functionality. Because two components on the circuit board (204) may have different load requirements, a single element may be unable to provide that load. As shown in FIG. 2, some components of the circuit board (204) are provided a load by the heat spreader plate (202) while the processing unit (206) is provided a load by the heat exchanger (200) and the TIM sheet (100). This configuration provides different load levels for different components on the circuit board (204).

Figure 3:
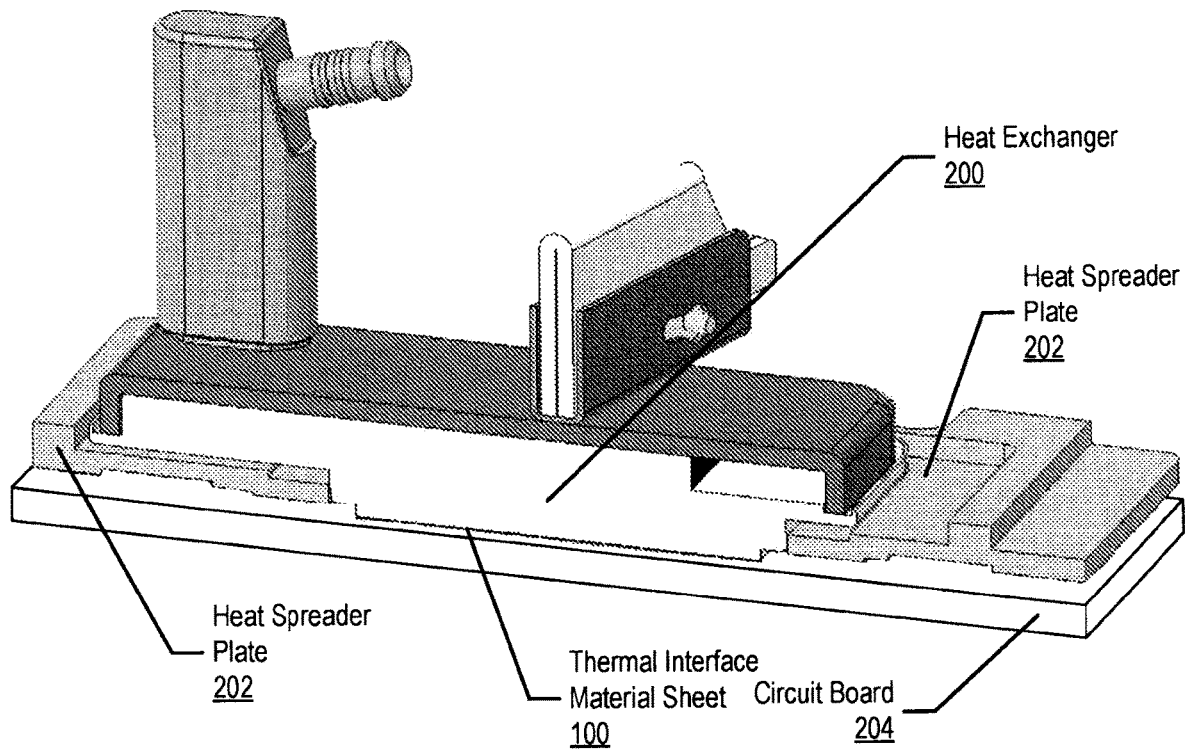
FIG. 3 sets forth a diagram depicting an example system with a TIM structure for directing heat in a three-dimensional space according to embodiments of the present invention.

FIG. 3 sets forth a diagram depicting an example system with a TIM structure for directing heat in a three-dimensional space according to embodiments of the present invention. Specifically, FIG. 3 depicts the elements of FIG. 2 fully assembled, with the TIM sheet (100) placed between the heat exchanger (200) and the heat spreader plate (202) attached to the circuit board (204). The heat exchanger (200) is in thermal contact with the processing unit (206) via the TIM sheet (100) and through the heat spreader plate cavity (208).

Figure 4:
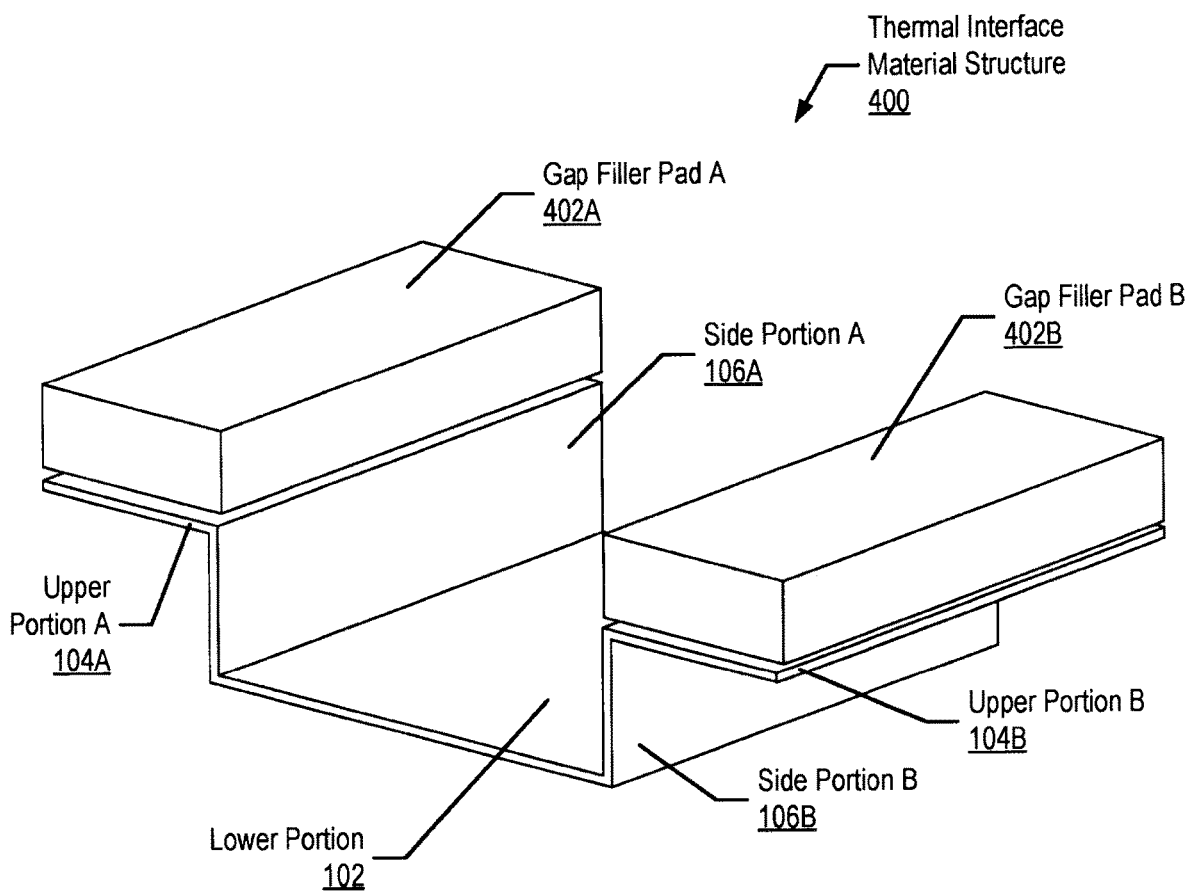
FIG. 4 sets forth a diagram depicting an example TIM structure for directing heat in a three-dimensional space according to embodiments of the present invention.

FIG. 4 sets forth a diagram depicting an example TIM structure for directing heat in a three-dimensional space according to embodiments of the present invention. As shown in FIG. 4, the TIM structure (400) includes a lower portion (102), two upper portions (upper portion A (104A), upper portion B (104B)), and two side portions (side portion A (106A), side portion B (106B)) of the TIM sheet.

The TIM structure (400) of FIG. 4 also includes two gap filler pads (gap filler pad A (402A), gap filler pad B (402B)). The gap filler pads (gap filler pad A (402A), gap filler pad B (402B)) are in thermal contact with the first upper portions (upper portion A (104A), upper portion B (104B)) of the TIM sheet. The gap filler pads (gap filler pad A (402A), gap filler pad B (402B)) are positioned between the TIM sheet and a heat exchanger, such as a cold plate. The gap filler pads (gap filler pad A (402A), gap filler pad B (402B)) may be used to create adequate thermal contact between the upper portions (upper portion A (104A), upper portion B (104B)) of the TIM sheet and the heat exchanger. An embodiment of the TIM structure that includes the gap filler pads (gap filler pad A (402A), gap filler pad B (402B)) has the advantage of providing adjustable thermal contact points between the upper portions (upper portion A (104A), upper portion B (104B)) of the TIM sheet and the heat exchanger. The gap filler pads (gap filler pad A (402A), gap filler pad B (402B)) may be comprised of a variety of different thermally conductive materials.

Figure 5:
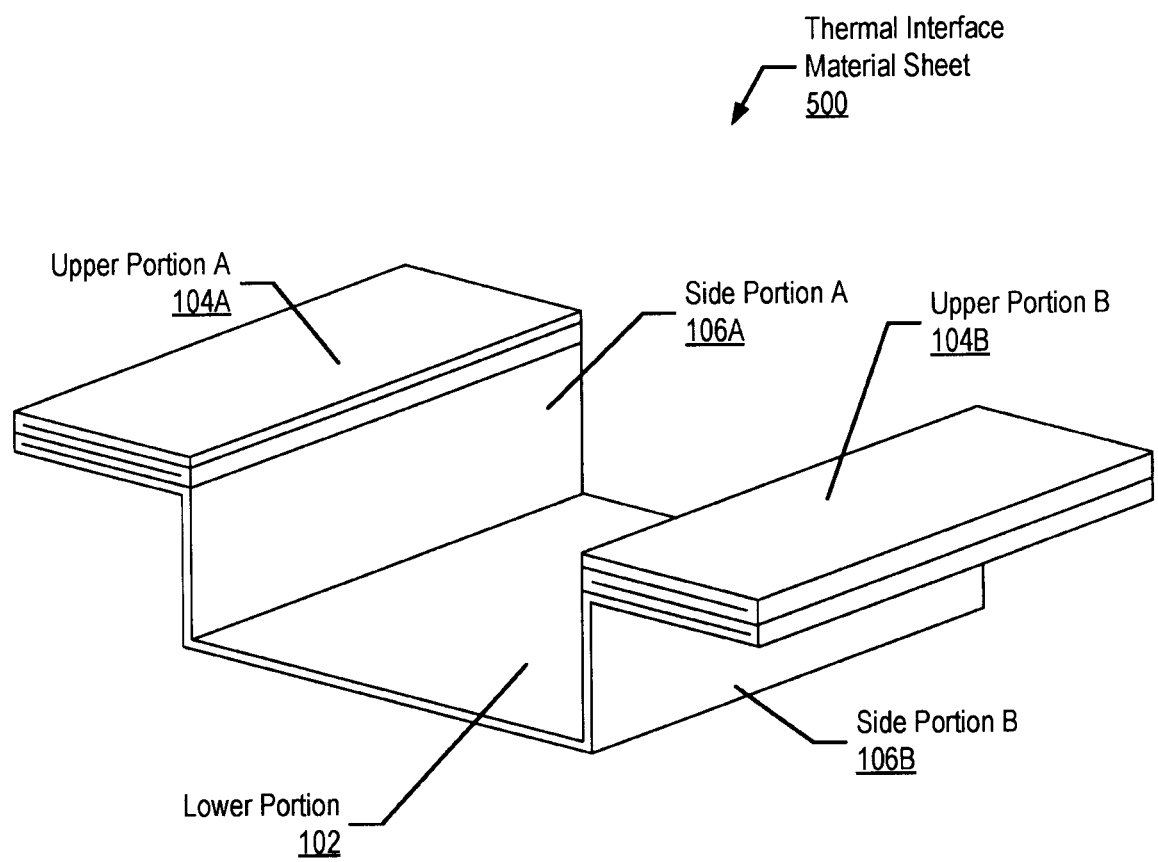
FIG. 5 sets forth a diagram depicting an example TIM sheet for directing heat in a three-dimensional space according to embodiments of the present invention.

FIG. 5 sets forth a diagram depicting an example TIM sheet for directing heat in a three-dimensional space according to embodiments of the present invention. As shown in FIG. 5, the TIM sheet (100) includes a lower portion (102), two upper portions (upper portion A (104A), upper portion B (104B)), and two side portions (side portion A (106A), side portion B (106B)). As shown in FIG. 5, the upper portions (upper portion A (104A), upper portion B (104B)) of the TIM sheet (500) include additional alternating folds creating adjacent layers of the TIM sheet (500) above the upper portions (upper portion A (104A), upper portion B (104B)).

An embodiment that includes alternative folds creating adjacent layers of the TIM sheet has the advantage of providing adjustable thermal contact points between the upper portions (upper portion A (104A), upper portion B (104B)) of the TIM sheet and the heat exchanger. Further, using alternating folds of the TIM sheet itself as a gap filler provides a continuous thermal interconnect that efficiently transfers heat from the upper portions (upper portion A (104A), upper portion B (104B)) of the TIM sheet to the heat exchanger.

In a similar embodiment, one or more upper portions (upper portion A (104A), upper portion B (104B)) of the TIM sheet may be coiled. The upper portions (upper portion A (104A), upper portion B (104B)) may be rolled on an axis into a spiral cylinder. An embodiment that includes a coiled upper portion has the advantage of filling cylindrical gaps that may exist between the heat spreader plate, upper portions of the TIM sheet, and heat exchanger.

Figure 6:
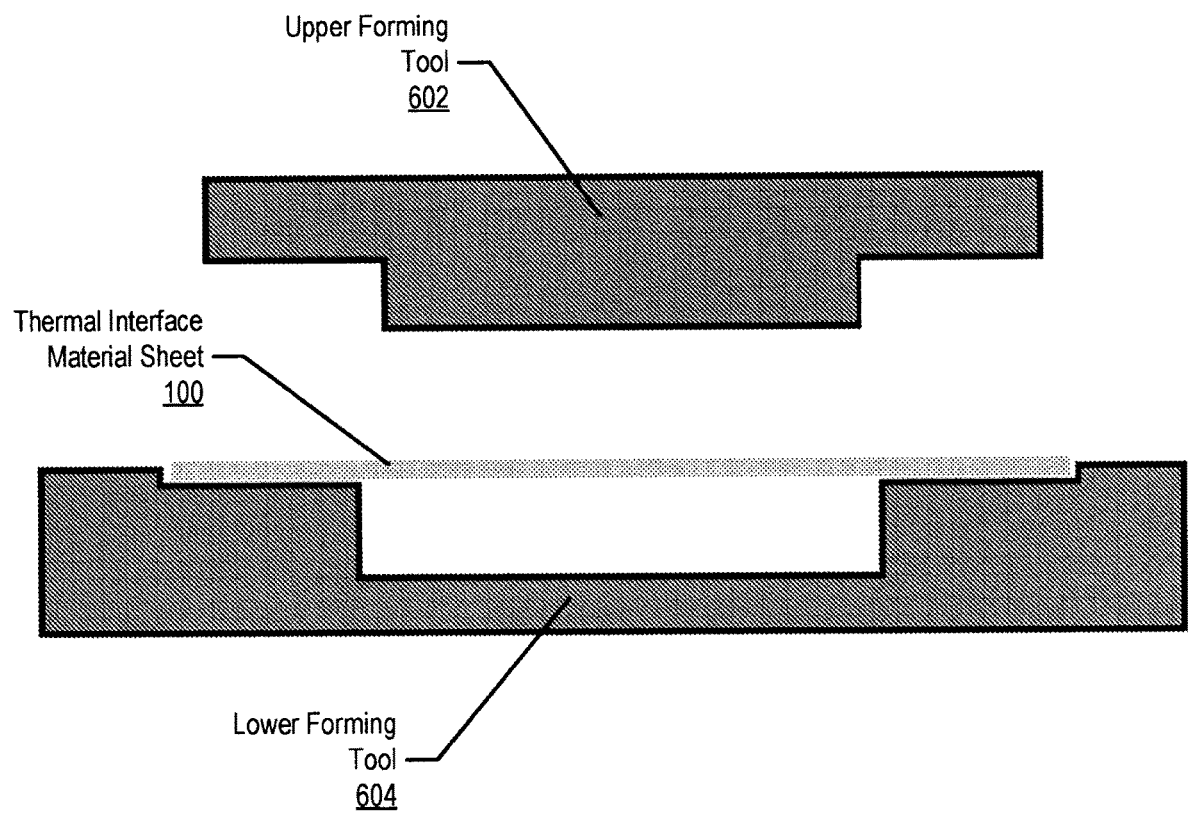
FIG. 6 sets forth an example system for creating a TIM sheet for directing heat in a three-dimensional space according to embodiments of the present invention.

FIG. 6 sets forth an example system for creating a TIM sheet for directing heat in a three-dimensional space according to embodiments of the present invention. As shown in FIG. 6, the system includes an upper forming tool (602) and a lower forming tool (604) with the TIM sheet (100) placed between the upper forming tool (602) and the lower forming tool (604). FIG. 6 depicts the forming tool and TIM sheet (100) prior to engagement and forming.

Figure 7:
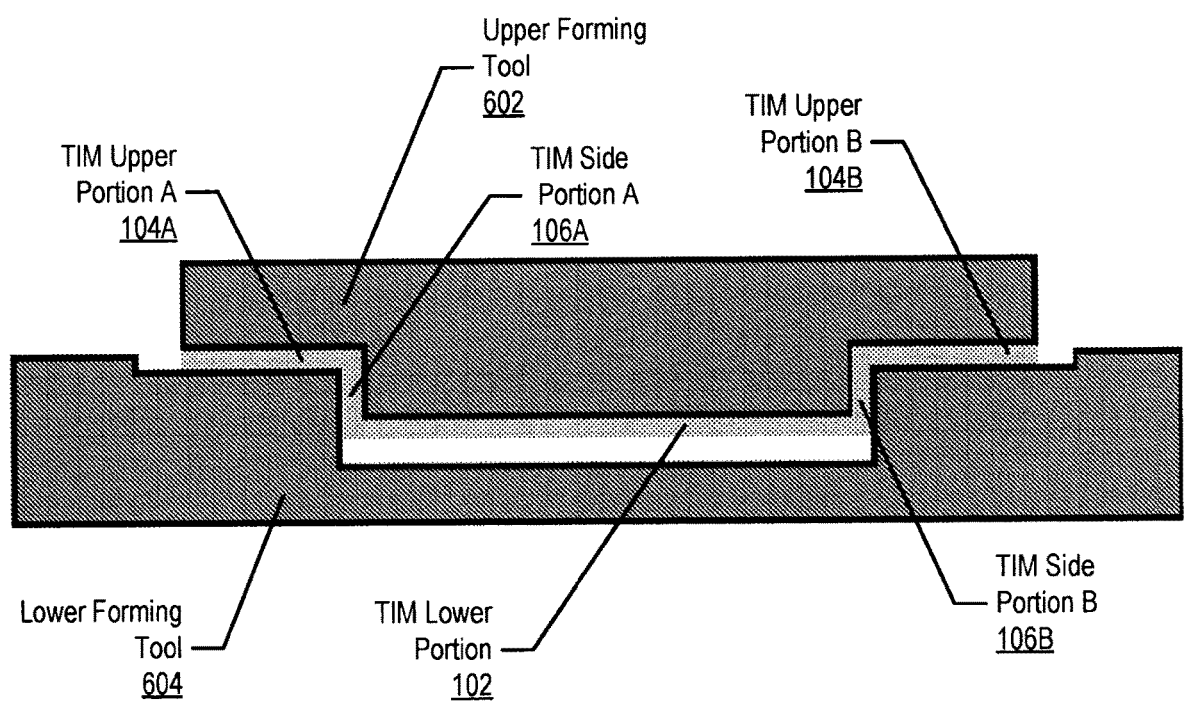
FIG. 7 sets forth an example system for creating a TIM sheet for directing heat in a three-dimensional space according to embodiments of the present invention.

FIG. 7 sets forth an example system for creating a TIM sheet for directing heat in a three-dimensional space according to embodiments of the present invention. As shown in FIG. 7, the system includes an upper forming tool (602) and a lower forming tool (604) with the TIM sheet (100) pressed between the upper forming tool (602) and the lower forming tool (604). FIG. 7 depicts the forming tool and TIM sheet (100) after engagement and forming. Specifically, pressing the upper forming tool (602) and the lower forming tool (604) has created the folds between the TIM lower portion (102) and the TIM side portions (side portion A (106A), side portion B (106B)), and the folds between the TIM side portions (side portion A (106A), side portion B (106B)) and the TIM upper portions (upper portion A (104A), upper portion B (104B)).

As shown in FIG. 6, pressing the upper forming tool to the lower forming tool compresses the upper portion of the TIM sheet without compressing the lower portion of the TIM sheet. An embodiment that presses the upper forming tool to the lower forming tool compresses the upper portion of the TIM sheet without compressing the lower portion of the TIM sheet has the advantage of maintaining the compressible integrity of the lower portion of the TIM sheet during the forming of the three-dimension TIM sheet. Maintaining the integrity of the lower portion of the TIM sheet during forming may result in better performance for the lower portion of the TIM sheet when in thermal contact with a component that produces a high amount of heat.

A modified forming tool may be used to create adjacent layers of the TIM sheet adjacent and substantially parallel to the upper portions of the TIM sheet (as depicted in FIG. 5). A modified forming tool may also be used to roll the first upper portion into a coil (as described in the discussion of FIG. 5).

Prior to pressing the upper forming tool to the lower forming tool, the TIM sheet may be scored along the anticipated folding lines. Specifically, the TIM sheet may be scored between the lower portion of the TIM sheet and the first side portion of the TIM sheet and scored between the first side portion of the TIM sheet and the first upper portion of the TIM sheet. Scoring the TIM sheet prior to folding has the advantage of precisely guiding the location of the fold within the TIM sheet, increasing the precision with which the TIM sheets are formed.

Figure 8:
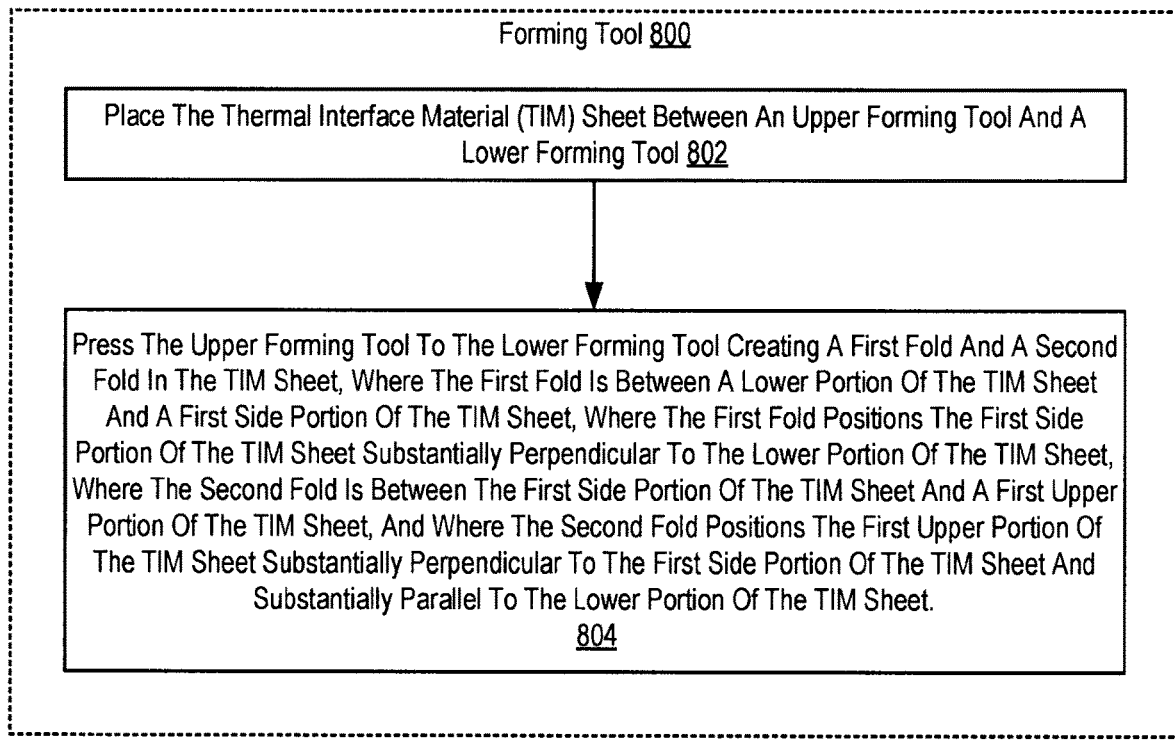
FIG. 8 sets forth a flow chart illustrating an exemplary method for creating thermal interface material structures for directing heat in a three-dimensional space according to embodiments of the present invention.

For further explanation, FIG. 8 sets forth a flow chart illustrating a further exemplary method for forming thermal interface material structures for directing heat in a three-dimensional space according to embodiments of the present invention that includes a forming tool (800) placing (802) a thermal interface material (TIM) sheet between an upper forming tool and a lower forming tool; and pressing (804) the upper forming tool to the lower forming tool creating a first fold and a second fold in the TIM sheet, wherein the first fold is between a lower portion of the TIM sheet and a first side portion of the TIM sheet, wherein the first fold positions the first side portion of the TIM sheet substantially perpendicular to the lower portion of the TIM sheet, wherein the second fold is between the first side portion of the TIM sheet and a first upper portion of the TIM sheet, and wherein the second fold positions the first upper portion of the TIM sheet substantially perpendicular to the first side portion of the TIM sheet and substantially parallel to the lower portion of the TIM sheet.

Pressing the upper forming tool to the lower forming tool may compress the upper portion of the TIM sheet without compressing the lower portion of the TIM sheet. This has the advantage of maintaining the compressible integrity of the lower portion of the TIM sheet during the forming of the three-dimension TIM sheet.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A system comprising:
    a circuit board comprising a first component having a first load requirement and a second component having a second load requirement;
    a heat exchanger; and
    a thermal interface material (TIM) sheet comprising:
        a lower portion positioned between and in thermal contact with the first component and the heat exchanger, wherein the lower portion is not compressed;
        a first upper portion positioned between and in thermal contact with the heat exchanger and the second component; and
        a first side portion connecting the lower portion to the first upper portion.

2. The system of claim 1, further comprising a heat spreader plate positioned between and in thermal contact with the second component and the first upper portion, wherein the heat spreader plate comprises a cavity exposing the first component, and wherein the first side portion connects the lower portion to the first upper portion through the cavity in the heat spreader plate.

3. The system of claim 1, further comprising a gap filler pad between and in thermal contact with the first upper portion and the heat exchanger, and wherein the first upper portion is compressed.

4. The system of claim 1, wherein the TIM sheet further comprises:
    a second upper portion positioned between and in thermal contact with the heat exchanger and the second component; and
    a second side portion connecting the lower portion to the second upper portion, wherein the second side portion is positioned substantially perpendicular to the lower portion.

5. The system of claim 1, wherein the second load requirement is less than the first load requirement.

6. The system of claim 1, wherein the first upper portion comprises alternating folds creating adjacent layers of the TIM sheet.

7. The system of claim 1, wherein the first upper portion is coiled.

8. An apparatus comprising:
    a first component, wherein the first component is a processing unit;
    a second component;
    a heat exchanger; and
    a thermal interface material (TIM) sheet comprising:
        a lower portion positioned between and in thermal contact with the first component and the heat exchanger, wherein the lower portion is not compressed;
        a first upper portion positioned between and in thermal contact with the heat exchanger and the second component; and
        a first side portion connecting the lower portion to the first upper portion.

9. The apparatus of claim 8, further comprising a heat spreader plate positioned between and in thermal contact with the second component and the first upper portion, wherein the heat spreader plate comprises a cavity exposing the first component, and wherein the first side portion connects the lower portion to the first upper portion through the cavity in the heat spreader plate.

10. The apparatus of claim 8, further comprising a gap filler pad between and in thermal contact with the first upper portion and the heat exchanger.

11. The apparatus of claim 8, wherein the TIM sheet further comprises:
    a second upper portion positioned between and in thermal contact with the heat exchanger and the second component; and
    a second side portion connecting the lower portion to the second upper portion.

12. The apparatus of claim 8, wherein the first upper portion comprises alternating folds creating adjacent layers of the TIM sheet.

13. The apparatus of claim 8, wherein the first upper portion is coiled.

14. The system of claim 1, wherein the first side portion is positioned substantially perpendicular to the lower portion.

15. The apparatus of claim 8, wherein the first side portion is positioned substantially perpendicular to the lower portion.

16. The system of claim 14, further comprising a first fold between the lower portion and the first side portion positioning the first side portion substantially perpendicular to the lower portion.

17. The system of claim 16, further comprising a second fold between the first side portion and the first upper portion positioning the first upper portion substantially perpendicular to the first side portion and substantially parallel to the lower portion.

* * * * *